United States Patent [19]

Kausch

[11] Patent Number: 4,544,622
[45] Date of Patent: Oct. 1, 1985

[54] NEGATIVE-ACTING PHOTORESIST IMAGING SYSTEM

[75] Inventor: William L. Kausch, Cottage Grove, Minn.

[73] Assignee: Minnesota Mining and Manufacturing Company, St. Paul, Minn.

[21] Appl. No.: 632,339

[22] Filed: Jul. 19, 1984

[51] Int. Cl.[4] .................. G03C 1/68; G03C 1/70; G03C 1/94
[52] U.S. Cl. .................... 430/278; 430/275; 430/271; 430/276; 430/280; 430/287; 430/926; 430/916; 430/950; 430/527
[58] Field of Search ........... 430/280, 285, 287, 910, 430/312, 272, 273, 278, 271, 275, 926, 920, 916, 950, 527, 276

[56] References Cited

U.S. PATENT DOCUMENTS

| | | | |
|---|---|---|---|
| 3,395,016 | 7/1968 | Loeb | 96/36 |
| 3,469,982 | 9/1969 | Celeste | 96/35.1 |
| 3,639,185 | 2/1972 | Colom et al. | 156/13 |
| 3,954,475 | 5/1976 | Bonham et al. | 96/67 |
| 4,104,072 | 8/1978 | Golda et al. | 96/68 |
| 4,193,797 | 3/1980 | Cohen et al. | 430/258 |
| 4,228,232 | 10/1980 | Rousseau | 430/271 |
| 4,316,949 | 2/1982 | Petrellis et al. | 430/159 |
| 4,476,215 | 10/1984 | Kausch | 430/287 X |

FOREIGN PATENT DOCUMENTS 976352 10/1975 Canada .
976353 10/1975 Canada .

*Primary Examiner*—John E. Kittle
*Assistant Examiner*—Cynthia Hamilton
*Attorney, Agent, or Firm*—Donald M. Sell; James A. Smith; Carole Truesdale

[57] ABSTRACT

A negative-acting photoresist imaging system is provided having a substrate, a metal layer, a latently sensitized, crosslinkable, negative-acting photoresist base layer, and a negative-acting photoresist layer. The system may further have an organic protective coat between the metal layer and the base layer, a matte top layer, and/or an antistatic layer on the back side of the substrate.

23 Claims, No Drawings

NEGATIVE-ACTING PHOTORESIST IMAGING SYSTEM

BACKGROUND OF THE INVENTION

1. Field of the Invention

This invention relates to a negative-acting photoresist imaging systems, and particularly negative-acting photoresist imaging systems which are useful in non-silver halide graphic arts films.

2. Description of the Prior Art

Negative-acting photoresist imaging systems have been used commercially for many years. In these imaging systems, negative-acting photoresist compositions are applied as a layer over a metallized substrate and then subjected to actinic radiation. The actinic radiation causes a change in solubility of the layer, usually by photoinitiated polymerization of components within the layer. When the imaged layer is subsequently treated (e.g., washed and lightly scrubbed) with a developer solution, such as an aqueous alkaline solution of pH greater than 12, the non-light struck areas of the layer are washed away. If the original layer contained a colorant material (e.g., dyes or pigment), development would leave an imagewise distribution of the colored layer as a final image. If an etching or plating process is performed on the developed layer, an etched or plated image is deposited on the substrate in the exposed areas where the photoresist layer had been removed by development. A wide variety of photoresist compositions exist in the art, and many have been used as photosensitive printing plate compositions in lithographic technology. Examples of photoresist compositions known in the art include U.S. Pat. Nos. 3,395,016, 3,469,982, 3,639,185 and 4,193,797, as well as Canadian Pat. Nos. 976,352 and 976,353.

Most of the negative-acting photoresist compositions known in the art use ethylenically unsaturated materials in combination with a free radical generating photoinitiator as the active ingredients. Acrylic functional materials (i.e., acryloyl and methacryloyl functional materials) are generally preferred in the art because of their speed, toughness upon cure, and moderate cost. Printing plate compositions, in particular, rely on the use of acrylic functional materials in various forms such as monomers, oligomers and polymers with acrylic functionality. Examples of such printing plate compositions and the use of various acrylic functional materials are shown, for example, in U.S. Pat. Nos. 4,316,949, 4,228,232, 4,104,072 and 3,954,475. Many of these compositions have found acceptable commercial uses, but they have tended to be weak in certain technically important areas, particularly toughness of the cured compositions, tackiness of the uncured composition, and cold flow of the resist layer.

The most commonly used imaging systems are based on silver halide technology, diazonium salt technology, or photopolymerizable composition technology. Each of these different systems has its own advantages and problems.

Silver halide films are the most widely used graphic arts material. These films show high resolution, high imaging speeds, and consistency in their performance. However, because of the cost of silver, systems using silver halide emulsions are becoming economically disadvantageous. Other disadvantages include the requirement for multiple steps in processng, unstable processing solutions, and lack of dimensional stability.

Imaging systems using diazonium salt compositions provide high resolution and are considerably less expensive than silver to produce. The visible image produced by most diazonium salt systems consists of a dye and tends to have limits on the maximum optical densities or image color obtainable, higher minimum densities than desirable, and often suffers from a low contrast. Other disadvantages include image fade on repeated exposure, lack of dimensional stability, surface pin holes, and lack of definition at the image edge. Although thermally developable diazonium salt systems are available in the marketplace, many diazonium salt image systems still rely upon ammonia development which is undesirable because of the difficulty of working in a closed environment with ammonia. Often the diazo image comprises a dye and is not considered archival in the micrographic context.

Photopolymeric imaging systems are both inexpensive and easy to make. However, these systems usually depend upon the loading of the photopolymeric layer with opacifying material to provide optical density, which tends to reduce the sensitivity of the photosensitive layer.

SUMMARY OF THE INVENTION

The present invention relates to a negative-acting photoresist imaging system comprising:
(a) a substrate;
(b) a metal layer adhered to said substrate;
(c) a latently sensitized, crosslinkable, negative-acting photoresist base layer adhered to said metallic layer, said base layer comprising
  (i) a polyfunctional acrylate monomer;
  (ii) an organic, polymeric, polyfunctional film-forming binder with more than one acryloyl group pendant therefrom;
  (iii) a polyfunctional, thermally activated, acid group crosslinking agent;
  (iv) an acid group-bearing polymeric binder; and
  (v) a non-active, photosensitive free-radical generator; and
(d) a negative-acting photoresist layer adhered to said base layer, said photoresist layer comprising
  (i) a polyfunctional acrylate monomer;
  (ii) an organic, polymeric, polyfunctional film-forming binder with more than one acryloyl group pendant therefrom;
  (iii) a polyfunctional, thermally activated, acid group crosslinking agent;
  (iv) an acid group-bearing polymeric binder;
  (v) a non-active, photosensitive free-radical generator; and
  (vi) an active, photosensitive free-radical generator.

The base layer and the photoresist layer also preferably contain a polyfunctional, acid group-bearing, oligomeric acrylate (other than the one used as the film-forming binder with pendant acrylate groups). Other imaging layer adjuvants such as dyes, pigments, fillers, and coating aids may be present in the base layer and the photoresist layer. The photoresist layer may also contain spectral sensitizers.

In preferred embodiments of the invention, the imaging system may also contain (1) an organic protective layer applied over the metal layer prior to application of the base layer, (2) a matte top coat applied over the photoresist layer to improve handling characteristics of the film, and/or (3) an anti-static layer applied to the back side of the substrate to further improve the handling characteristics of the film.

The imaging system of the present invention possesses good thermal stability, excellent photosensitivity, and high resolution.

DETAILED DESCRIPTION OF THE INVENTION

The substrate may be any surface or material onto which metal may be vapor-deposited. The substrate may be rough or smooth, transparent or opaque, and continuous or porous. It may be of natural or synthetic polymeric resin (thermoplastic or thermoset), ceramic, glass, metal, paper, fabric, and the like. For most commercial purposes the substrate is preferably a polymeric resin film such as polyester (e.g., polyethylene terephthalate), cellulose ester, polycarbonate, polyvinyl resin (e.g., polyvinyl chloride, polyvinylidene chloride, polyvinylbutyral, polyvinylformal), polyamide, polyimide, polyacrylate (e.g., copolymers and homopolymers of acrylic acid, methacrylic acid, n-butyl acrylate, acrylic anhydride and the like), polyolefin, and the like. More preferably, the substrate is polyester. The substrate should be transparent to actinic radiation in the range of 330 to 450 nm and is preferably smooth and non-porous. It may contain fillers such as those materials generally used in the formation of films such as coating aids, lubricants, antioxidants, ultraviolet radiation absorbers, surfactants, catalysts and the like. The substrate is preferably 25 microns to 250 microns thick, more preferably 100 microns to 200 microns thick.

The vapor-deposited metal layer may be any vapor-deposited metal or metalloid layer. According to the practice of the present invention, the term metal layer is defined as a layer comprising metal, metal alloys, metal salts, and metal compounds. The corresponding meaning applies to the term metalloid layer. The term metal in metal layer is defined in the present invention to include semi-metals (i.e., metalloids) and semiconductor materials. Metals include materials such as aluminum, antimony, beryllium, bismuth, cadmium, chromium, cobalt, copper, gallium, germanium, gold, indium, iron, lead, magnesium, manganese, molybdenum, nickel, palladium, rhodium, selenium, silicon, silver, strontium, tellirium, tin, titanium, tungsten, vanadium, and zinc. Preferably the metal is selected from aluminum, chromium, nickel, tin, titanium and zinc. More preferably the metal is aluminum. Metal alloys such as aluminum-iron, aluminum-silver, bismuth-tin, and iron-cobalt alloys are included in the term metal layer and are useful. Metal salts such as metal halides, metal carbonates, metal nitrates and the like are also useful. Metal compounds such as metal oxides and metal sulfides also have utility in imaging systems. Metal layers comprising mixtures of these materials such as mixtures of metal-metal oxides, metal-metal salts, and metal salts-metal oxides are also of interest.

The thickness of the vapor-deposited metal layer depends upon the particular needs of the final product. In imaging constructions, for example, the thickness should be at least about 500 A. Generally, the layer would be no thicker than 5000 A which would require a long etching period. A more practical commercial range would be between 600 and 1500 A. A preferred range would be between 700 and 1200 A and a more preferred range would be between 700 and 1000 A. The optical density of the vapor-deposited metal layer is generally in the range of 2 to 8, preferably 3 to 6, most preferably 4 to 5.

Vapor-deposition of the metal layer may be accomplished by any means. Thermal evaporation of the metal, ion plating, radio frequency sputtering, A.C. sputtering, D.C. sputtering and other known processes for deposition may be used in the practice of the present invention. The pressure may vary greatly during coating, but is usually in the range of $10^{-6}$ to $10^{-4}$ torr.

In a preferred embodiment of the present invention an organic protective layer is deposited over the metal layer. Examples of such organic protective layers are taught, for example, in U.S. Pat. No. 4,405,678, incorporated herein by reference, U.S. Pat. No. 4,268,541 and Japanese Patent Publication No. 56-9736.

The negative-acting photoresist system is a double layer, acrylate-based photopolymerizable system comprising a base layer and a photoresist layer. The base layer is not photosensitive in the 330 to 450 nm exposure window, but can be crosslinked when overcoated with a photosensitized resist coat, that is, the base layer is latently photosensitive. This latent photosensitivity in the base layer aids in developer penetration and clean out in the non-image areas, as well as reducing coating related defects.

The latently sensitized, crosslinkable, negative-acting photoresist base layer contains (i) a polyfunctional acrylate monomer, (ii) an organic polymeric, polyfunctional film-forming binder with more than one acryloyl group pendant therefrom; (iii) a polyfunctional, thermally activated, acid group crosslinking agent; (iv) an acid group-bearing polymeric binder; and (v) a non-active photosensitive free-radical generator.

The polyfunctional acrylate monomers according to the present invention are well known in the art and include, for example, such materials as the polyacrylate and polymethacrylate esters of alkanepolyols, e.g., pentaerythritol tetraacrylate, tris(2-acryloxyethyl)isocyanurate, tris(2-methyacryloxyethyl tetrahydrofurfurylmethacrylate, 1-aza-5-acryloxymethyl-3,7-dioxabicyclo [3,0,0] octane (ADOZ), bis[4-(2-acryloxyethyl)phenyl]dimethyl methane, diacetone acrylamide, and acrylamidoethyl methacrylate. Such monomers are disclosed in U.S. Pat. Nos. 3,895,949, 4,037,021 and 4,304,923.

The polyfunctional acrylate monomer must have at least two acrylic functionalities thereon (either acrylyol or methacrylyol, with 2–8 groups preferred and 3–6 groups most preferred). The monomer should generally be present as 10–60 weight percent of the reactive composition and may comprise more than a single monomer component. Preferably, the monomer comprises 30–50 weight percent.

The organic, polymeric polyfunctional pendant acryloyl (including methacryloyl) group bearing film-forming binder should have a molecular weight equal to or greater than 800, and preferably has a molecular weight between 1,000 and 100,000. More preferably, the binder has a molecular weight between 1,000 and 20,000. Any pendant acryloyl group may be present on the binder as on the end of bridging groups such as hydrocarbon chains (e.g., alkylene groups), carbamate groups, etc. The oligomer may have pendant acid groups in addition to the acryloyl groups, as disclosed in U.S. Pat. No. 4,304,923. The presence of the binder tends to reduce the tackiness of the coated composition and provides cross-linking sites. The binder should be present in an amount between 10 to 60 weight percent of the composition.

The polyfunctional acrylate oligomers useful in the practice of the present invention are generally well known in the art. These oligomers comprise intermediate length polymer backbones having pendant acrylic (acryloyl or methacryloyl) or polyacrylic groups. The backbones may comprise a host of materials from various chemical classes such as the polyolyls disclosed in U.S. Pat. No. 4,304,923 or other free hydrogen containing backbones which can be reacted with isocyanate or caprolactone terminated acrylic or polyacrylic groups. Preferably, the polyfunctional acrylate oligomer has an acrylic equivalent weight between 100 and 5,000, with at least two acrylic groups per molecule. According to the teachings of U.S. Pat. No. 4,304,923 which includes the most preferred oligomers of the present invention and is incorporated herein by reference, as many as 12 or 16 acrylic groups can easily be present on the oligomer. Molecular weights for the oligomer are generally between 3,000 and 50,000, preferably between 5,000 and 30,000, and most preferably between 10,000 and 20,000. The oligomer can be present in amounts up to 60% by weight of the composition, is preferably present in amounts between 1 and 60% by weight, and more preferably is present in amounts between 4 and 40% by weight of the composition.

The organic polymeric polyfunctional acid group-bearing polymeric binder may comprise any polymeric backbone having acid pendant groups. Preferably the acid pendant groups are selected from carboxylic acid groups, sulfonic acid groups, phosphoric acid groups and anhydrides. Poly(ethylenically unsaturated) addition polymers are preferred for the backbone, but as previously noted, any polymeric binder with pendant acid groups is useful. These polymers are well-known in the art. Examples include commercially available styrene/maleic anhydride copolymers, ethylene/maleic anhydride copolymers, and other carboxylic acid anhydride copolymers with ethylenically unsaturated comonomers. Any pendent acid group may be present in the binder. It is preferred to have carboxylic acid groups, but sulfonic, phosphoric or carboxylic anhydride groups may also be used. The polymer should have an acid equivalent weight of 1,000 or less.

The acid group bearing polymeric binder should have a molecular weight equal to or greater than 800, and preferably between 1,000 and 100,000. More preferably, the binder has a molecular weight between 1,000 and 20,000. The polymer is not necessarily a film-forming agent. The preferred binder according to the practice of the present invention is a copolymer of styrene and maleic anhydride having a molecular weight of between 1,000 and 3,000. The binder is preferably present in amounts of 10 to 60% by weight of the composition.

Any polyfunctional, thermally activated acid reactive crosslinking agent is useful in the practice of the present invention. Any material having at least two groups thermally reactable with the acid functionalities present on the binder would be useful in the practice of the present invention. The preferred class of crosslinking agent includes the aziridines, as disclosed in U.S. Pat. Nos. 3,115,482; 3,240,720; 3,318,930; and 3,440,242. All thermally activated epoxy resins will also perform as these acid cross-linking agents. Examples include difunctional cycloaliphatic epoxides, such as "ERL-4221", available from Union Carbide. Difunctional epoxide-aziridine compounds disclosed in U.S. Pat. No. 3,240,720 constitute an example of the usefulness of both epoxides and aziridines. These cross-linking agents should be used in an amount between 0.05 and 2.5 weight percent of the composition. This component can be used to reduce the cold flow of the resist and reduce tack of the applied resist layer.

A non-active photosensitive free-radical generator must also be present in the base layer.

The terms "active" and "non-active", as they refer to free radical generators, have definite and critical meaning according to the practice of the present invention. An "active" free radical generator is a compound which, in the absence of any sensitizing compounds, can photoinitiate the cure of a 3 micrometer wet thickness film of methyl methacrylate to a non-tacky film when present as 5% by weight of the methyl methacrylate and irradiated in the absence of $O_2$ with $3\times10^{-5}$ ergs/cm$^2$ of 330 to 450 nm radiation. A "non-active" free radical generator is a compound which is not an active free radical generator at 330 to 450 nm, but when spectrally sensitized (e.g., with Michler's ketone) will, in combination with the spectral sensitizer perform the function of an active free radical generator. That is, the spectrally sensitized non-active free radical generator will cure a 3 micrometer wet thickness layer of methyl methacrylate to a non-tacky film under the conditions described for the definition of an active photoinitiator.

The photosensitive, non-active, free radical generator is a generic class of materials well known in the art. Such materials are photosensitive aromatic iodonium salts, sulfonium salts, benzophenones, phosphonium salts, quinones, nitrozo compounds, mercapto compounds, biimidazoles, and triaryl imidazoles. All other non-active photosensitive free radical initiators would be useful in the practice of the present invention. Such free radical generators are disclosed in such art as U.S. Pat. Nos. 3,729,313, 3,887,450, 3,895,949, 4,042,819, 4,058,400 and 4,058,401. This photosensitive, non-active, free radical generator is generally used in amounts of 1 to 10% by weight of the composition, and preferably between 1.5 and 7% by weight of the composition.

An optional component, the polyfunctional, acid group-bearing oligomeric acrylic functional material, is useful in amounts up to 60% by weight of the composition. The oligomer is preferably present in an amount of between 1 and 60% by weight. The oligomer preferably has a molecular weight greater than 5,000 and less than 50,000, more preferably between 5,000 and 30,000, and most preferably between 10,000 and 15,000. Examples of preferred oligomers are shown in U.S. Pat. Nos. 4,316,949, 4,304,923 and 4,153,778. This oligomer is like that of the organic, polymeric, polyfunctional pendant acryloyl group-bearing film-forming binder and has pendant acid groups.

Dyes, pigments, fillers, antistatic agents, lubricants, surfactants, and other coating adjuvents may be used as desired in the base layer.

The latently sensitized, crosslinkable, negative acting photoresist base layer is generally applied at a coating weight of 1.0 to 3.0 g/m$^2$, preferably 1.5 to 2.5 g/m$^2$ and more preferably 1.75 to 2.25 g/m$^2$.

The negative-acting photoresist layer comprises (i) a polyfunctional acrylate monomer, (ii) an organic, polymeric, polyfunctional, film-forming binder with more than one acryloyl group pendant therefrom, (iii) a polyfunctional, thermally activated, acid group cross-linking agent, (iv) an acid group-bearing polymeric binder, (v) a non-active, photosensitive free-radical generator, and (vi) an active, photosensitive free-radical generator. This composition is disclosed and claimed in U.S. patent application Ser. No 554,886, filed on Nov. 25, 1983, now U.S. Pat. No. 4,476,215, which is incorporated herein by reference.

The polyfunctional acrylate monomers include those useful in the base layer. The monomer should generally be present as 10 to 50 weight percent of the reactive composition and may comprise more than a single monomer component. Preferably the monomer comprises 30 to 50 weight percent.

The organic, polymeric, polyfunctional, pendant acryloyl group-bearing, film-forming binders include those useful in the base layer. The binder can be present in amounts up to 60% by weight of the composition, is preferably present in amounts between 1 and 60% by weight, and more preferably is present in amounts between 4 and 40% by weight of the composition.

The polyfunctional, thermally activated, acid group crosslinking agents used in the photoresist layer are those useful in the base layer. These crosslinking agents should be present in an amount between 0.05 and 2.5 weight percent of the composition or the reactive components of the composition.

The acid group bearing polymeric binders used in the photoresist layer are those useful in the base layer. This binder should be present in amounts of 10 to 60 weight percent of the composition.

The non-active photosensitive free-radical generators used in the photoresist layer are those useful in the base layer. The non-active photosensitive free-radical generators should be present in amounts of 1 to 10 weight percent of the composition, preferably 1.5 to 7.0 weight percent of the composition.

As an optional component, the polyfunctional oligomeric, acid group-bearing, acrylic functional materials useful in the base layer may also be incorporated in the photoresist layer in amounts up to 60 weight percent of the composition and is preferably present in an amount between 1 and 60 weight percent.

The photoresist layer, in addition to the components similarly contained in the base layer, contains an active, photosensitive free radical generator as defined hereinabove.

Any active photosensitive free radical photoinitiator can be used in the practice of the present invention. The preferred class of materials within this group are the s-triazines as disclosed in U.S. Pat. Nos. 3,954,475 and 3,987,037. These materials are generically known as chromophor-substituted vinylhalomethyl s-triazines. These materials are, photosensitive free radical generators and are generally used in amounts of 1 to 10% by weight of the composition, and preferably as 2 to 8% by weight of the composition.

The active photosensitive free radical generator should be present in an amount between 1 and 10% by weight of the composition or the reactive components of the photosensitive layer. The non-active photosensitive free radical generator should also be present in an amount of 1 to 10% by weight of reactive components of the photosensitive layer. The combination of these two materials provides a synergistic activity to the photosensitive properties of the composition, and the use of the active photosensitive free radical generator tends to remove some amount of low molecular weight materials from the composition which acts to further toughen the polymerized product.

The photoresist layer also preferably contains a spectral sensitizer for sensitizing the non-active free radical generator in both the photoresist layer and the base layer. Spectral sensitizers are preferably used in molar proportions of 0.01/1 to 2/1 for the non-active free radical generator in the photoresist layer. More preferably ratios of 0.05 to 1.5 are used (sensitizer/photoinitiator). This would be equivalent to 0.01 to 20% by weight of the composition, preferably 0.05 to 15% by weight of the composition, and most preferably 0.05 to 5% by weight of the composition. Of course any effective (i.e., spectral sensitizing) amount of a spectral sensitizer is useful.

A wide spectrum of other materials known to be useful in photoresist lithographic compositions can be used in the photoresist layer according to the present invention. For example, spectral sensitizers for the iodonium salts as disclosed in U.S. Pat. No. 4,250,053 may be used, as can Michler's ketone and other sensitizers for either or both of the photosensitive free radical generators. Dyes, pigments, fillers, antistatic agents, lubricants, surfactants, and other coating aids may be used as desired in the present invention.

The negative acting photoresist layer is generally present in an amount of 1 to 3 g/m$^2$, preferably 1.5 to 2.5 g/m$^2$, and more preferably 1.75 to 2.25 g/m$^2$.

In a preferred embodiment of the invention, a matte top coat is applied over the photoresist layer to improve the handling characteristics of the film, such as the drawdown to printing plates or contact with other films without blocking. This matte top coat provides a nonglossy appearance to the imageable element and can provide a control on the friction characteristics of the surface. Furthermore, if the material is to be stacked or rolled, the protuberance of the matting agent will prevent or reduce adherence between layers caused by the exclusion of air between them. Typical photographic matting agents such as polymethylmethacrylate and its copolymers, silica, and the like are generally useful. The top coat is preferably present in an amount of 0.1 to 2.0 g/m$^2$, more preferably 0.2 to 1.5 g/m$^2$. Top coat compositions which are useful in the present invention include those disclosed in U.S. Pat. No. 4,072,527 and U.S. Pat. No. 4,072,528.

In a further preferred embodiment of the imaging system of the present invention, an anti-static layer is applied to the back side of the substrate. The use of an anti-static layer serves to further improve the handling characteristics of the film. The antistatic layer is preferably present in an amount of 0.05 to 0.5 g/m$^2$, more preferably 0.1 to 0.3 g/m$^2$. Useful anti-static materials are those which provide the desired anti-static properties at coating levels such that the coating is transparent to actinic radiation in the range of 330 to 450 nm. Particularly useful are conductive polymers, such as those having pendant quaternary groups, and include, for example, those disclosed in U.S. Pat. No. 4,225,334 and U.S. Pat. No. 4,214,035.

These and other aspects of the present invention will be further shown in the following examples.

EXAMPLE 1

An aluminum layer 700 Å thick was vapor deposited on a 4 mil thick polyester substrate. Over the aluminum layer was coated an organic protective coat as taught in Example 6 of U.S. Pat. No. 4,405,678. A crosslinkable, latently negative-acting photoresist base layer was prepared by mixing, in parts by weight:

| pentaerythritol tetraacrylate | 21 |
|---|---|
| partially esterfied 1:1 styrene: maleic anhydride resin | 21 |
| reaction product of a 5000–10,000 molecular weight polyol and 0.9 molar equivalents of isocyanate ethyl methacrylate per mole of available hydroxyl groups | 25 |
| carboxylic acid substituted polyacrylol functional urethane oligomer of Example 1 of U.S. Pat. No. 4,304,923 | 8 |
| triarylsulfonium hexafluoroantimonate | 4 |
| Phthalo Blue pigment | 16.8 |
| carbon black | 4.2 |

The mixture was diluted using 2:1 ethylene dichloride:methyl ethyl ketone to 15% solids and coated over the protective coat at 2.2 g/m² solids. This was then dried at 105° C. for 2 minutes.

A negative-acting photoresist composition was prepared by mixing, in parts by weight:

| pentaerythritol tetraacrylate | 21 |
|---|---|
| partially esterfied 1:1 styrene: maleic anhydride resin | 21 |
| reaction product of a 5000–10,000 molecular weight and 0.9 molar equivalents of isocyanate ethyl methacrylate per mole of available hydroxyl groups | 14 |
| carboxylic acid substituted polyacryloyl functional urethane oligomer of Example 1 of U.S. Pat. No. 4,304,923 | 14 |
| Michler's ketone | 2 |
| diphenyliodonium hexafluorophosphate | 3 |
| s-triazine (compound 4, Table 1 of U.S. Pat. No. 3,954,475) | 4 |
| Phthalo Blue pigment | 16.8 |
| carbon black | 4.2 |

The mixture was diluted with 2:1 ethylene dichloride:methyl ethyl ketone to approximately 15% solids and coated over the base layer at 2.2 g/m² solids. The coating was dried at 105° C. for 2 minutes.

The thus prepared film was evaluated utilizing a halftone step wedge (Chauncey Scale) with 150 lines/in. halftone screens for positive and negative tint levels of 3, 5, 10, 20, 30, 40, 50, 60, 70, and 80 percent. A value of 5 points is assigned to each halftone area for a total of 100 points. Evaluation of each screen tint box provides a number from 0–5 with the following characteristics:

5—all dots or holes present and of uniform good quality
4—up to 10% of dots or holes non-uniform
3—dots or holes present, but generally poor quality
2—up to 40% of dots or holes missing, plugged or misformed
1—more than 50% of dots or holes missing plugged or mixformed
0—complete plugging in holes or no dots present.

The values for each of the twenty grading points are added together to obtain a resolution value.

The prepared film was exposed in a Berkey-Ascor 2 KW lithographic imaging system for 15 sec., washed and lightly scrubbed using, as the developer, Solution C of Example 3 of U.S. Pat. No. 4,314,022. The resolution value for the film of this example is 85–100, showing excellent resolution.

EXAMPLE 2

A film was prepared as in Example 1. To this film were added a matte top coat and an antistatic coating as follows:

A matte top coat was prepared by mixing, in parts by weight:

| polyvinyl alcohol (10% by weight in deionized water) | 75.0 |
|---|---|
| polymethylmethacrylate (6 microns avg. size as 13% solids in deionized H₂O) | 19.2 |
| ethylene oxide-propylene oxide block polymer surfactant (10% in deionized water) | 4.8 |
| n-propanol | 50.0 |
| deionized water | 851.0 |

The mixture was diluted to 2% solids with water and applied to the photoresist layer at 1.0 g/m² solids. This coating was dried at 100° C.

An anti-static coating is prepared by neutralizing a polystyrene sulfonate resin to pH 7 with sodium hydroxide. The solution is further diluted with 70:30 isopropanol:water to 5% solids and applied to the backside of the substrate at 0.3 g/m² solids. The coating was dried at 100° C.

The film was tested for resolution as in Example 1. The film had excellent resolution with a resolution value of 85–100. The handleability characteristics of the film were improved over that of Example 1.

EXAMPLE 3

A film was prepared as in Example 2, substituting the following non-pigmented composition for the base layer, with amounts in parts by weight.

| partially esterified 1:1 styrene:maleic anhydride resin | 11.6 |
|---|---|
| difunctional cycloaliphatic epoxide | 5.7 |
| pentaerythritol tetraacrylate | 18.4 |
| partially esterfied 1:1 styrene maleic anhydride resin | 40.2 |
| reaction product of a 5000–10,000 molecular weight polyol and 0.9 molar equivalents of isocyanate ethyl methacrylate per mole of available hydroxyl groups | 18.4 |
| triarylsulfonium hexafluoroantimonate | 5.7 |

The film was evaluated as in Example 1. The resolution value for this film was 85–100, showing excellent resolution.

EXAMPLE 4

A film was prepared as in Example 2, substituting the following composition for the base layer, with amounts in parts by weight.

| partially esterified 1:1 styrene:maleic anhydride resin | 9.3 |
|---|---|
| difunctional cycloaliphatic epoxide | 4.7 |
| pentaerythritol tetraacrylate | 15 |
| partially esterfied 1:1 styrene: maleic anhydride resin | 32.7 |
| reaction product of a 5000–10,000 molecular weight polyol and 0.9 molar equivalents of isocyanate ethyl methacrylate per mole of available hydroxyl groups | 15 |
| triarylsulfonium hexafluoroantimonate | 4.7 |

| | |
|---|---|
| -continued | |
| Phthalo Blue pigment | 18.6 |

The film was evaluated as in Example 1. The resolution value for this film was 85–100, showing excellent resolution.

COMPARATIVE EXAMPLE 1

A film was prepared as in Example 1, omitting the base layer, and applying the photoresist layer at a thickness of 4.4 g/m$^2$. The film was evaluated as in Example 1 and had a resolution value of 60–80.

COMPARATIVE EXAMPLE 2

A film was prepared as in Example 1, substituting a layer of photoresist coating for the base layer, to achieve a film having no base layer and two layers of photoresist coating. The film was evaluated as in Example 1 and had a resolution value of 60–80.

Various modifications and alterations of this invention will be apparent to those skilled in the art without departing from the scope and spirit of this invention and this invention should not be restricted to that set forth herein for illustrative purposes.

What is claimed is:

1. A negative-acting photoresist imaging system comprising:
   (a) a substrate;
   (b) a metal layer adhered to said substrate;
   (c) a latently sensitized crosslinkable, negative-acting photoresist base layer adhered to said metallic layer, said base layer comprising:
      (i) a polyfunctional acrylate monomer;
      (ii) an organic, polymeric, polyfunctional film-forming binder with more than one acryloyl group pendant therefrom;
      (iii) a polyfunctional, thermally activated, acid group crosslinking agent;
      (iv) an acid group-bearing polymeric binder; and
      (v) a non-active, photosensitive free-radical generator; and
   (d) a negative-acting photoresist layer adhered to said base layer, said photoresist layer comprising:
      (i) a polyfunctional acrylate monomer;
      (ii) an organic, polymeric, polyfunctional film-forming binder with more than one acryloyl group pendant therefrom;
      (iii) a polyfunctional, thermally activated, acid group crosslinking agent;
      (iv) an acid group-bearing polymeric binder;
      (v) a non-active, photosensitive free-radical generator; and
      (vi) an active, photosensitive free-radical generator.

2. An imaging system as claimed in claim 1, wherein said substrate is transparent to actinic radiation in the range of 330 to 450 nm.

3. An imaging system as claimed in claim 1, wherein said substrate comprises a synthetic polymeric resin film having a thickness of 25 microns to 250 microns.

4. An imaging system as claimed in claim 1, wherein said substrate is polyethylene terephthalate.

5. An imaging system as claimed in claim 1, wherein said metal layer is aluminum.

6. An imaging system as claimed in claim 1, where said metal layer thickness is between 600 and 1500 Å.

7. An imaging system as claimed in claim 1, wherein said polyfunctional acrylate monomer comprises 10–60 weight percent of each of the base layer and photoresist layer.

8. An imaging system as claimed in claim 1, wherein said film-forming binder comprises between 10 and 60 weight percent of each of the base layer and photoresist layer.

9. An imaging system as claimed in claim 1, wherein said acid group crosslinking agent comprises between 0.05 and 2.5 weight percent of each of the base layer and photoresist layer.

10. An imaging system as claim in claim 1, wherein said acid group bearing polymeric binder comprises 10 to 60 weight percent of each of the base layer and photoresist layer.

11. An imaging system as claimed in claim 1, wherein said non-active, photosensitive free-radical generator comprises between 1 and 10 weight percent of each of the base layer and photoresist layer.

12. An imaging system as claimed in claim 1, wherein said active, photosensitive free-radical generator comprises between 1 and 10 weight percent of the photoresist layer.

13. An imaging system as claimed in claim 1, wherein said photoresist layer further comprises an effective amount of a spectral sensitizer for said non-active free-radical generator in said base layer and said photoresist layer.

14. An imaging system as claimed in claim 13, wherein a spectral sensitizer is present in an amount equal to 0.1 to 2.0 molar parts per mole of said non-active, photosensitive, free-radical generator in said photoresist layer.

15. An imaging system as claimed in claim 1 wherein, in each of said base layer and said photoresist layer,
   said polyfunctional acrylate monomer has 2 to 8 groups selected from the group consisting of acryloyl and methacryloyl,
   said film-forming binder has a molecular weight between 1,000 and 100,000, and
   said acid group bearing organic polymeric binder has a molecular weight between 1,000 and 100,000.

16. An imaging system as claimed in claim 15 wherein said acid group bearing organic polymeric binder has pendant carboxylic acid groups.

17. An imaging system as claimed in claim 16 wherein said pendant carboxylic acid groups on said acid group bearing organic polymeric binder provide an acid equivalent weight of 1,000 or less to said binder.

18. An imaging system as claimed in claim 1, wherein said acid group bearing organic polymeric binders comprise a copolymer of a carboxylic acid anhydride and an ethylenically unsaturated comonomer.

19. An imaging system as claimed in claim 1, wherein said acid group crosslinking agents are selected from the group consisting of aziridines, epoxy resins, and mixed aziridine-epoxy compounds.

20. An imaging system as claimed in claim 1 wherein said reactive, photosensitive free-radical generators comprise an s-triazine.

21. An imaging system as claimed in claim 1, further comprising an organic protective layer between said metal layer and said base layer.

22. An imaging system as claimed in claim 1, further comprising a matte top coat over said photoresist layer.

23. An imaging system as claimed in claim 1, further comprising an antistatic layer on said substrate surface opposite said metal layer.

* * * * *